(12) United States Patent  (10) Patent No.: US 7,885,139 B2
Ryu et al.  (45) Date of Patent: Feb. 8, 2011

(54) MULTI-CHIP PACKAGE

(75) Inventors: Je Il Ryu, Seoul (KR); You Sung Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 290 days.

(21) Appl. No.: 12/102,701

(22) Filed: Apr. 14, 2008

(65) Prior Publication Data

US 2009/0231897 A1 Sep. 17, 2009

(30) Foreign Application Priority Data

Nov. 30, 2007 (KR) .................... 10-2007-0123329

(51) Int. Cl.
G11C 8/00 (2006.01)
(52) U.S. Cl. ..................... 365/230.05; 365/189.02; 365/225.7
(58) Field of Classification Search ............ 365/230.05, 365/189.02, 225.7
See application file for complete search history.

(56) References Cited

U.S. PATENT DOCUMENTS

| 5,838,059 A | 11/1998 | Inoue et al. |
| 7,130,240 B2 * | 10/2006 | Chae et al. .................. 365/218 |
| 7,149,135 B2 * | 12/2006 | Okuno ....................... 365/200 |
| 7,495,970 B1 * | 2/2009 | Tang et al. ............. 365/189.08 |

FOREIGN PATENT DOCUMENTS

| CN | 1165354 | 11/1997 |
| JP | 2003-007963 | 1/2003 |
| KR | 1020040065776 A | 7/2004 |
| KR | 100486217 B1 | 4/2005 |

* cited by examiner

*Primary Examiner*—Pho M Luu
(74) *Attorney, Agent, or Firm*—Townsend and Townsend and Crew LLP

(57) ABSTRACT

A multi-chip package includes a plurality of memory chips and a control chip, wherein the control chip stores information about whether the memory chips are operating normally and selects chips that are operating normally according to an address signal.

17 Claims, 6 Drawing Sheets

MULTI-CHIP PACKAGE

CROSS-REFERENCES TO RELATED APPLICATIONS

The present application claims priority to Korean patent application number 10-2007-123329, filed on Nov. 30, 2007, which is incorporated by reference in its entirety.

BACKGROUND OF THE INVENTION

The present invention relates to a multi-chip package including one or more chips and, more particularly, to a multi-chip package in which only normally operational chips can be selected and used when failed chips exist in the multi-chip package.

In line with the recent development of the semiconductor industry and the requirements of users, electronic devices need to be further miniaturized and designed to be more light-weight. One of technologies used to meet the requirements is multi-chip packaging. Multi-chip packing provides a plurality of semiconductor chips in one package. A multi-chip package improves characteristics associated with miniaturization, light-weightedness and mounting when compared with several different packages including semiconductor chips.

A package in which a plurality of chips are mounted as described above operates in response to a select signal for selecting a chip. In general, while one chip is operating, the remaining chips are not operated.

In a multi-chip package, each chip is generally selected using an externally input address. In the case of a package device including four chips, the first chip is set to '00', the second chip is set to '01', the third chip is set to '10', and the fourth chip is set to '11'. Each chip is selected according to an input address.

The external addresses are sequentially input in order from '00' to '11'. If any one chip malfunctions, the sequence of the addresses becomes irregular, causing failure of the package device.

BRIEF SUMMARY OF THE INVENTION

The present invention is directed towards a multi-chip package in which when any one of a plurality of chips fails in a package device including the plurality of chips, the multi-chip package operates normally using only the remaining chips.

According to an aspect of the present invention, a multi-chip package includes a plurality of memory chips, and a control chip for storing information about whether the memory chips are operating normally and selecting chips that are operating normally according to an address signal.

The control chip includes a fuse circuit, a case logic, a chip select logic, and a control unit. The fuse circuit stores information about whether the chips are operating normally and outputs fuse signals with respect to the respective chips based on the stored chip information. The case logic logically combines the fuse signals output from the fuse circuit and outputs case signals according to respective combination results. The chip select logic outputs chip select signals that sequentially select chips, which are operating normally, according to the case signals. The control unit controls the fuse circuit to control a fuse signal with respect to a chip that is not operating normally.

The control chip further includes an address circuit that sequentially generates and outputs a plurality of enable signals according to the input address signals.

The fuse circuit includes fuse signal output units for the respective chips. Each of the fuse signal output units includes a high voltage pump that generates and outputs a high voltage in a test mode, a first switching element that outputs a fuse signal of a second voltage level according to a voltage level of a first node, and a level shifter that applies the high voltage, which is generated by the high voltage pump, to the first switching element in response to a control signal in the test mode. The first switching element reaches breaking capacity when applied with the high voltage and outputs the fuse signal as the second voltage level.

The first switching element includes a low voltage transistor.

Each of the fuse signal output units includes a second switching element that connects the first node to a ground voltage in a normal operation mode.

The case logic includes case signal output units that output different case signals, respectively, according to cases decided according to a combination of the fuse signals output from the fuse circuit.

The chip select logic includes a plurality of chip select units that are respectively operated according to the case signals.

Each of the plurality of chip select units outputs a chip select signal that selects a chip, which is operating normally, according to a combination of the respective set case signals and the enable signals.

According to another aspect of the present invention, a multi-chip package including a control chip includes a fuse circuit, a case logic, a chip select logic, and a control unit. The fuse circuit outputs fuse signals to indicate whether a plurality of memory chips are operating normally. The case logic logically combines the fuse signals output from the fuse circuit and outputs case signals according to respective combination results. The chip select logic outputs chip select signals that sequentially select chips, which are operating normally, according to the case signals. The control unit controls the fuse circuit to control a fuse signal with respect to a chip that is not operating normally.

The control chip further includes an address circuit that sequentially generates and outputs a plurality of enable signals according to the input address signals.

The fuse circuit includes fuse signal output units for the respective chips. Each of the fuse signal output units includes a high voltage pump that generates and outputs a high voltage in a test mode, a first switching element that outputs a fuse signal of a second voltage level according to a voltage level of a first node, and a level shifter that applies the high voltage, which is generated by the high voltage pump, to the first switching element in response to a control signal in the test mode. The first switching element reaches breaking capacity when applied with the high voltage and outputs the fuse signal as the second voltage level.

The first switching element includes a low voltage transistor.

Each of the fuse signal output units includes a second switching element that connects the first node to a ground voltage in a normal operation mode.

The case logic includes case signal output units that output different case signals, respectively, according to cases decided according to a combination of the fuse signals output from the fuse circuit.

The chip select logic includes a plurality of chip select units that are respectively operated according to the case signals.

Each of the plurality of chip select units outputs a chip select signal that selects a chip, which is operating normally, according to a combination of the respective set case signals and the enable signals.

According to another aspect of the present invention, a multi-chip package includes a plurality of memory chips and a control chip. The control chip configured to store information about whether the memory chips have failed, and select chips that have not failed according to an address signal.

According to another aspect of the present invention, a multi-chip package including a control chip includes a fuse circuit for outputting fuse signals to indicate whether a plurality of memory chips have failed, a case logic for logically combining the fuse signals output from the fuse circuit and outputting case signals according to respective combination results, a chip select logic for outputting chip select signals that sequentially select chips that have not failed according to the case signals, and a control unit for controlling the fuse circuit to control a fuse signal with respect to a chip that has failed.

DESCRIPTION OF SPECIFIC EMBODIMENTS

Specific embodiments according to the present invention will be described with reference to the accompanying drawings.

The present invention is not limited to the disclosed embodiments, but may be implemented in various configurations. The embodiments are provided to complete the disclosure of the present invention and to allow those having ordinary skill in the art to understand the scope of the present invention. The present invention is defined by the scope of the claims.

Figure 1:
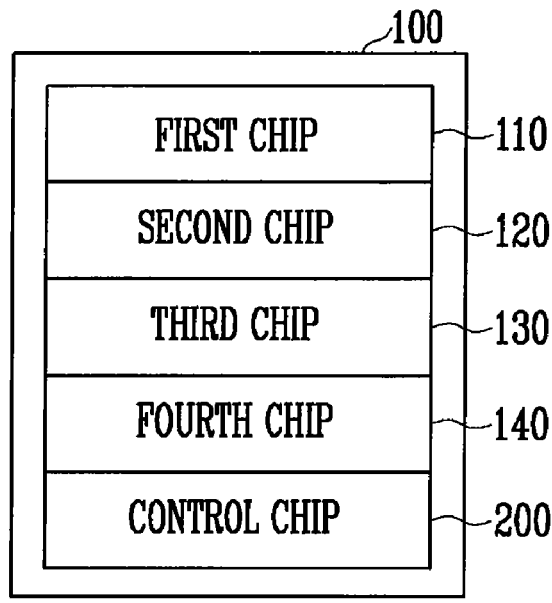
FIG. 1 shows the structure of a multi-chip package.

FIG. 1 shows the structure of a multi-chip package.

Referring to FIG. 1, the multi-chip package 100 includes first to fourth chips 110, 120, 130, 140, and a control chip 200.

The first to fourth chips 110-140 are selected and operated by the control chip 200. The first to fourth chips 110-140 are memory devices, and the control chip 200 selects the first to fourth chips 110-140 according to an externally input address.

The control chip 200 is described below.

Figure 2A:
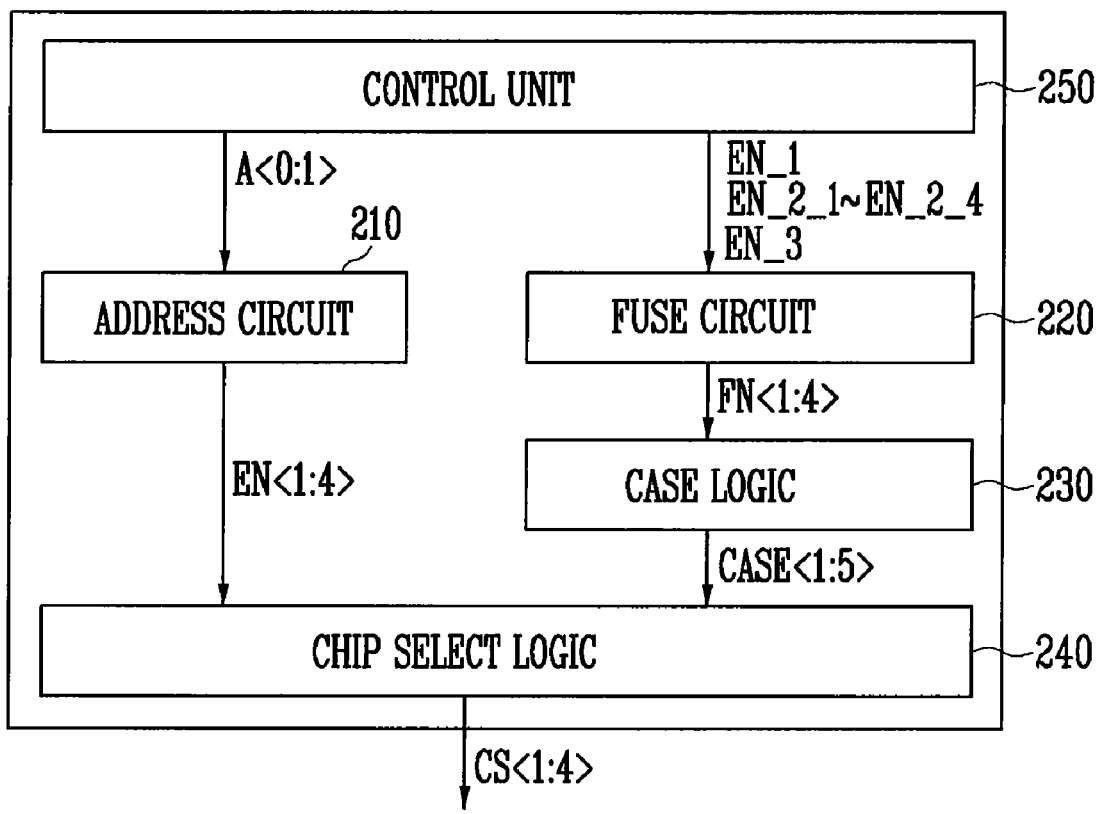
FIG. 2A is a detailed block diagram of a control chip shown in FIG. 1.

FIG. 2A is a detailed block diagram of the control chip shown in FIG. 1.

Referring to FIG. 2A, the control chip 200 includes an address circuit 210, a fuse circuit 220, a case logic 230, a chip select logic 240 and a control unit 250.

The address circuit 210 outputs first to fourth enable signals EN<1:4> of the first to fourth chips 110-140 based on externally input address information A<0:1>. The fuse circuit 220 includes an electric fuse circuit, and outputs information about chips, which are not operating normally according to control signals, as first to fourth fuse signals FN<1:4>.

The case logic 230 selects a package operation case based on the first to fourth fuse signals FN<1:4> of the fuse circuit 220 and outputs first to fifth case signals CASE<1:5>. The chip select logic 240 outputs first to fourth chip select signals CS<1:4> based on the first to fourth enable signals EN<1:4> of the address circuit 210 and the first to fifth case signals CASE<1:5> of the case logic 230. The first to fourth chips 110 to 140 are sequentially selected in response to the first to fourth chip select signals CS<1:4>.

The control unit 250 provides the address circuit 210 with the address information A<0:1> employing externally input addresses, and outputs a control signal, which causes the fuse of the fuse circuit 220 to reach breaking capacity, based on information about an inoperable chip.

The address circuit 210, the fuse circuit 220, the case logic 230 and the chip select logic 240 are described in detail below.

Figure 2B:
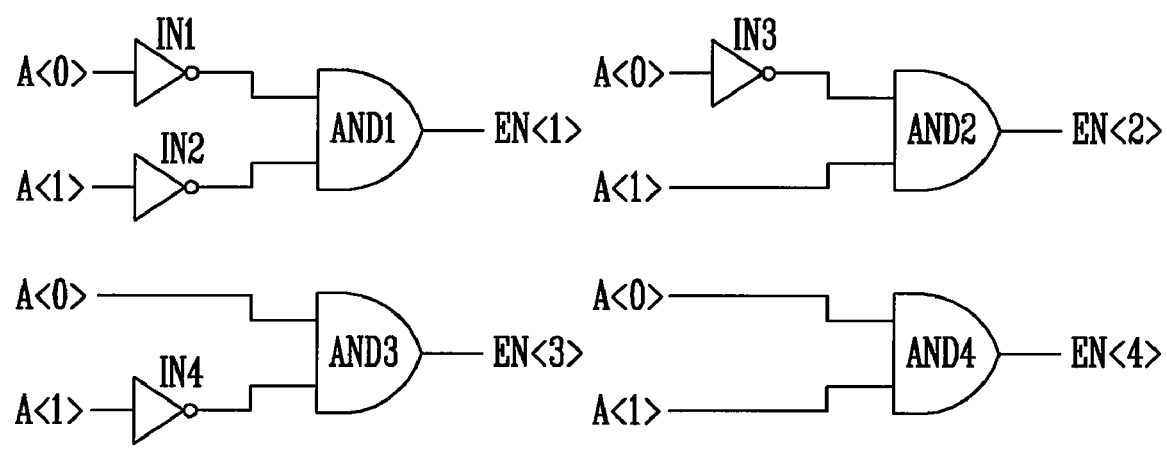
FIG. 2B is a detailed circuit diagram of an address circuit shown in FIG. 2A.

FIG. 2B is a detailed circuit diagram of the address circuit shown in FIG. 2A.

Referring to FIG. 2B, the address circuit 210 according to an embodiment of the present invention includes first to fourth inverters IN1, IN2, IN3, IN4 and first to fourth AND gates AND1, AND2, AND3, AND4 to output the first to fourth enable signals EN<1:4>, respectively.

The first inverter IN1 inverts and outputs the address information A<0>, and the second inverter IN2 inverts and outputs the address information A<1>. The outputs of the first inverter IN1 and the second inverter IN2 are input to the first AND gate AND1. The first AND gate AND1 performs an AND operation on the outputs of the first inverter IN1 and the second inverter IN2 and outputs the result as the first enable signal EN<1>.

The third inverter IN3 inverts and outputs the address information A<0>, and the output of the third inverter IN3 and the address information A<1> are input to the second AND gate AND2. The second AND gate AND2 performs an AND operation on the output of the third inverter IN3 and the address information A<1> and outputs the result as the second enable signal EN<2>.

The fourth inverter IN4 inverts and outputs the address information A<1>, and the output of the fourth inverter IN4 and the address information A<0> are input to the third AND gate AND3. The third AND gate AND3 performs an AND operation on the output of the fourth inverter IN4 and the address information A<0> and outputs the result as the third enable signal EN<3>.

The fourth AND gate AND4 receives the address information A<0:1>, performs an AND operation on the received address information A<0:1>, and outputs the result as the fourth enable signal EN<4>. The address information A<0:1> is sequentially increased and therefore counted in order of [00], [01], [10] and [11]. When one chip fails, the address signals are increased in order of [00], [01] and [10] irrespective of the sequence of the chips.

The first to fourth enable signals EN<1:4> are output according to the address information A<0:1> as follows.

TABLE 1

| A<0>:A<1> | |
|---|---|
| 0:0 | EN1 |
| 0:1 | EN2 |
| 1:0 | EN3 |
| 1:1 | EN4 |

As shown in Table 1, the address circuit 210 outputs the first to fourth enable signals EN<1:4> at a high level based on the address information A<0:1>. The first to fourth enable signals EN<1:4> are input to the chip select logic 240 and are logically combined with the first to fifth case signals CASE<1:5>, so that the first to fourth chip select signals CS<1:4> for selecting the first to fourth chips 110 to 140 are output.

The fuse circuit 220 that outputs the first to fourth fuse signals FN<1:4> according to operating states of the first to fourth chips 110 to 140 is described below.

Figure 2C:
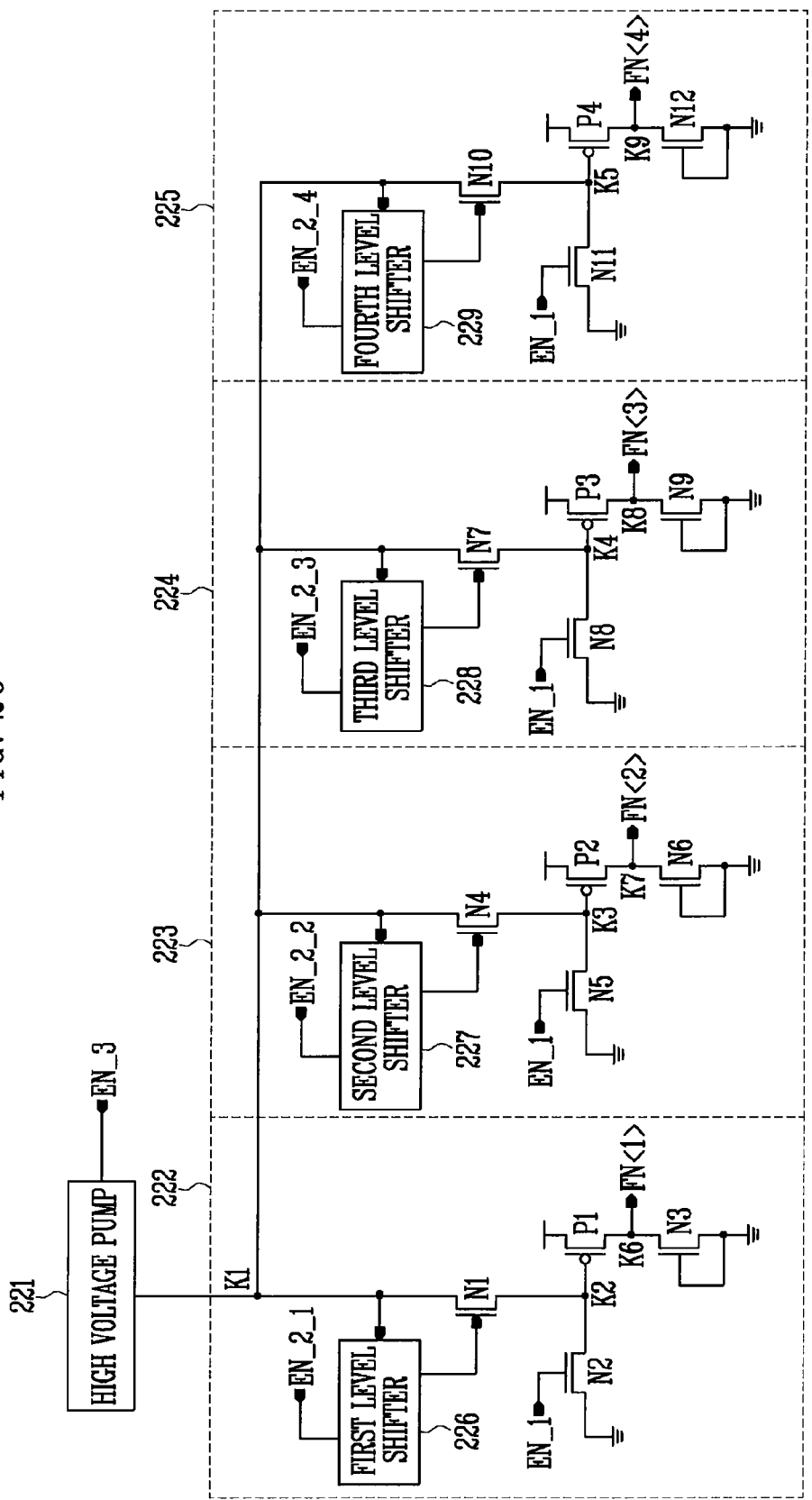
FIG. 2C is a detailed circuit diagram of a fuse circuit shown in FIG. 2A.

FIG. 2C is a detailed circuit diagram of the fuse circuit shown in FIG. 2A.

Referring to FIG. 2C, the fuse circuit 220 includes a high voltage pump 221 and first to fourth fuse signal generators 222, 223, 224, 225.

The first to fourth fuse signal generators 222-225 includes first to fourth level shifters 226, 227, 228, 229, first to twelfth NMOS transistors N1-N12 and first to fourth PMOS transistors P1, P2, P3, P4.

The high voltage pump 221 is operated in response to the control signal EN_3 of the control unit 250, and outputs a high voltage to a node K1 when the control signal EN_3 is input at a high level. The first to fourth fuse signal generators 222-225 output the first to fourth fuse signals FN<1:4>, respectively.

The first level shifter 226 is operated in response to the control signal EN_2_1, and receives the high voltage, which is output from the high voltage pump 221, through the node K1. The first level shifter 226 then outputs the high voltage after a lapse of a predetermined time period. The first NMOS transistor N1 is connected between the node K1 and a node K2. To the gate of the first NMOS transistor N1 is input the output of the first level shifter 226.

The second NMOS transistor N2 is connected between the node K2 and a ground node. To the gate of the second NMOS transistor N2 is input the control signal EN_1. The first PMOS transistor P1 is connected between a power supply voltage and a node K6. The gate of the first PMOS transistor P1 is connected to the node K2.

The third NMOS transistor N3 is connected between the node K6 and the ground node. The gate of the third NMOS transistor N3 is also connected to the ground node. The third NMOS transistor N3 is diode connected. The first fuse signal FN<1> is output through the node K6.

The second level shifter 227 is operated in response to the control signal EN_2_2, and receives the high voltage, which is output from the high voltage pump 221, through the node K1. The second level shifter 227 then outputs the high voltage after a lapse of a predetermined time period. The fourth NMOS transistor N4 is connected between the node K1 and a node K3. To the gate of the fourth NMOS transistor N4 is input the output of the second level shifter 227.

The fifth NMOS transistor N5 is connected between the node K3 and the ground node. To the gate of the fifth NMOS transistor N5 is input the control signal EN_1. The second PMOS transistor P2 is connected between a power supply voltage and a node K7. The gate of the second PMOS transistor P2 is connected to the node K3.

The sixth NMOS transistor N6 is connected between the node K7 and a ground node. The gate of the sixth NMOS transistor N7 is also connected to the ground node. The second fuse signal FN<2> is output through the node K7.

The third level shifter 228 is operated in response to the control signal EN_2_3, and receives the high voltage, which is output from the high voltage pump 221, through the node K1. The third level shifter 228 then outputs the high voltage after a lapse of a predetermined time period. The seventh NMOS transistor N7 is connected between the node K1 and a node K4. To the gate of the seventh NMOS transistor N7 is input the output of the third level shifter 228.

The eighth NMOS transistor N8 is connected between the node K4 and a ground node. To the gate of the eighth NMOS transistor N8 is input the control signal EN_1. The third PMOS transistor P3 is connected between a power supply voltage and a node K8. The gate of the third PMOS transistor P3 is connected to the node K4.

The ninth NMOS transistor N9 is connected between the node K8 and a ground node. The gate of the ninth NMOS transistor N9 is also connected to the ground node. The third fuse signal FN<3> is output through the node K8.

The fourth level shifter 229 is operated in response to the control signal EN_2_4, and receives the high voltage, which is output from the high voltage pump 221, through the node K1. The fourth level shifter 229 then outputs the high voltage after a lapse of a predetermined time period. The tenth NMOS transistor N10 is connected between the node K1 and a node K5. To the gate of the tenth NMOS transistor N10 is input the output of the fourth level shifter 229.

The eleventh NMOS transistor N11 is connected between the node K5 and a ground node. To the gate of the eleventh NMOS transistor N11 is input the control signal EN_1. The fourth PMOS transistor P4 is connected between a power supply voltage and a node K9. To the gate of the fourth PMOS transistor P4 is connected the node K5.

The twelfth NMOS transistor N12 is connected between the node K9 and a ground node. The gate of the twelfth NMOS transistor N12 is connected to the ground node.

The first to twelfth NMOS transistors N1-N12 are transistors that activate with respect to a high voltage. The first to fourth PMOS transistors P1-P4 are transistors that are deactivated when a high voltage flows therethrough.

Thus, by deactivating the first to fourth PMOS transistors P1-P4 using a high voltage, the first to fourth fuse signals FN<1:4> can be controlled. Therefore, information about failed chips can be stored. For example, when a failed chip is the first chip 110, the first PMOS transistor P1 can be deactivated so that the first fuse signal FN<1> is output at a low level.

A more detailed description of the operation in accordance with embodiments of the invention is provided below.

The case logic 230 that outputs the first to fifth case signals CASE<1:5> according to the first to fourth fuse signals FN<1:4> is described below.

Figure 2D:
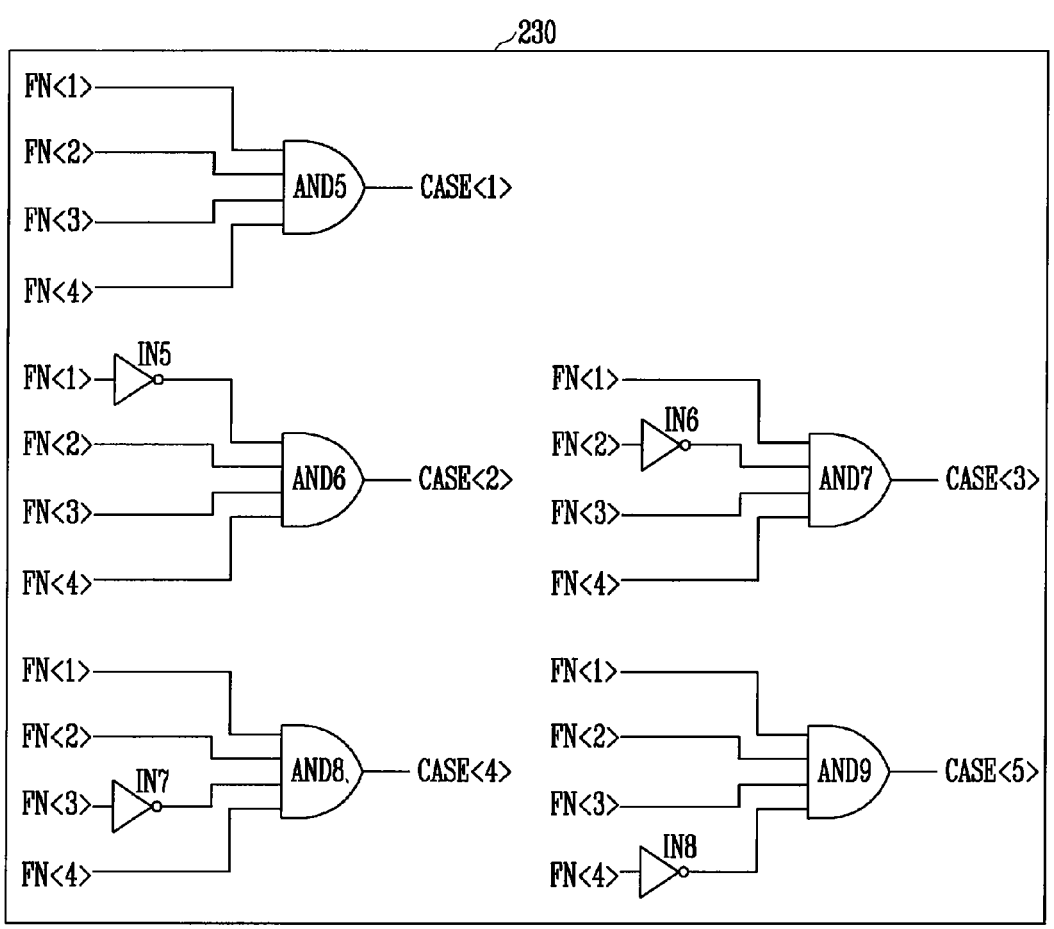
FIG. 2D is a detailed circuit diagram of a case logic shown in FIG. 2A.

FIG. 2D is a detailed circuit diagram of a case logic shown in FIG. 2A.

Referring to FIG. 2D, the case logic 230 includes fifth to ninth AND gates AND5-AND9 and fifth to eighth inverters IN5-IN8 to logically combine the first to fourth fuse signals FN<1:4> and output the first to fifth case signals CASE<1:5>.

The fifth AND gate AND5 receives the first to fourth fuse signals FN<1:4>, performs an AND operation on the first to fourth fuse signals FN<1:4>, and outputs the result as the first case signal CASE1. The sixth AND gate AND6 receives the first fuse signal FN<1>, which is inverted by the fifth inverter IN5, and the second to fourth fuse signals FN<2:4>, performs an AND operation on the inverted first fuse signal FN<1> and the second to fourth fuse signals FN<2:4>, and outputs the result as the second case signal CASE<2>.

The seventh AND gate AND7 receives the first fuse signal FN<1>, the second fuse signal FN<2> inverted by the sixth inverter IN6, and the third and fourth fuse signals FN<3:4>, performs an AND operation on the first fuse signal FN<1>, the inverted second fuse signal FN<2>, and the third and fourth fuse signals FN<3:4>, and outputs the result as the third case signal CASE<3>.

The eighth AND gate AND8 receives the first and second fuse signals FN<1:2>, the third fuse signal FN<3> inverted by the seventh inverter IN7, and the fourth fuse signal FN<4>, performs an AND operation on the first and second fuse signals FN<1:2>, the inverted third fuse signal FN<3> and the fourth fuse signal FN<4>, and outputs the result as the fourth case signal CASE<4>.

The ninth AND gate AND9 receives the first to third fuse signals FN<1:3> and the fourth fuse signal FN<4> inverted by the eighth inverter IN8, performs an AND operation on the first to third fuse signals FN<1:3> and the inverted fourth fuse signal FN<4>, and outputs the result as the fifth case signal CASE<5>.

The first to fifth case signals CASE<1:5> are signals output depending on whether the first to fourth chips 110 to 140, respectively, are operational or not.

The following Table 2 lists case signals, which are classified according to the first to fourth fuse signals FN<1:4>.

TABLE 2

|  | CASE<1> | CASE<2> | CASE<3> | CASE<4> | CASE<5> |
|---|---|---|---|---|---|
| FN<1> | 1 | 0 | 1 | 1 | 1 |
| FN<2> | 1 | 1 | 0 | 1 | 1 |
| FN<3> | 1 | 1 | 1 | 0 | 1 |
| FN<4> | 1 | 1 | 1 | 1 | 0 |

The chip select logic 240 outputs the first to fourth chip select signals CS<1:4> according to the first to fifth case signals CASE<1:5>.

Figure 2E:
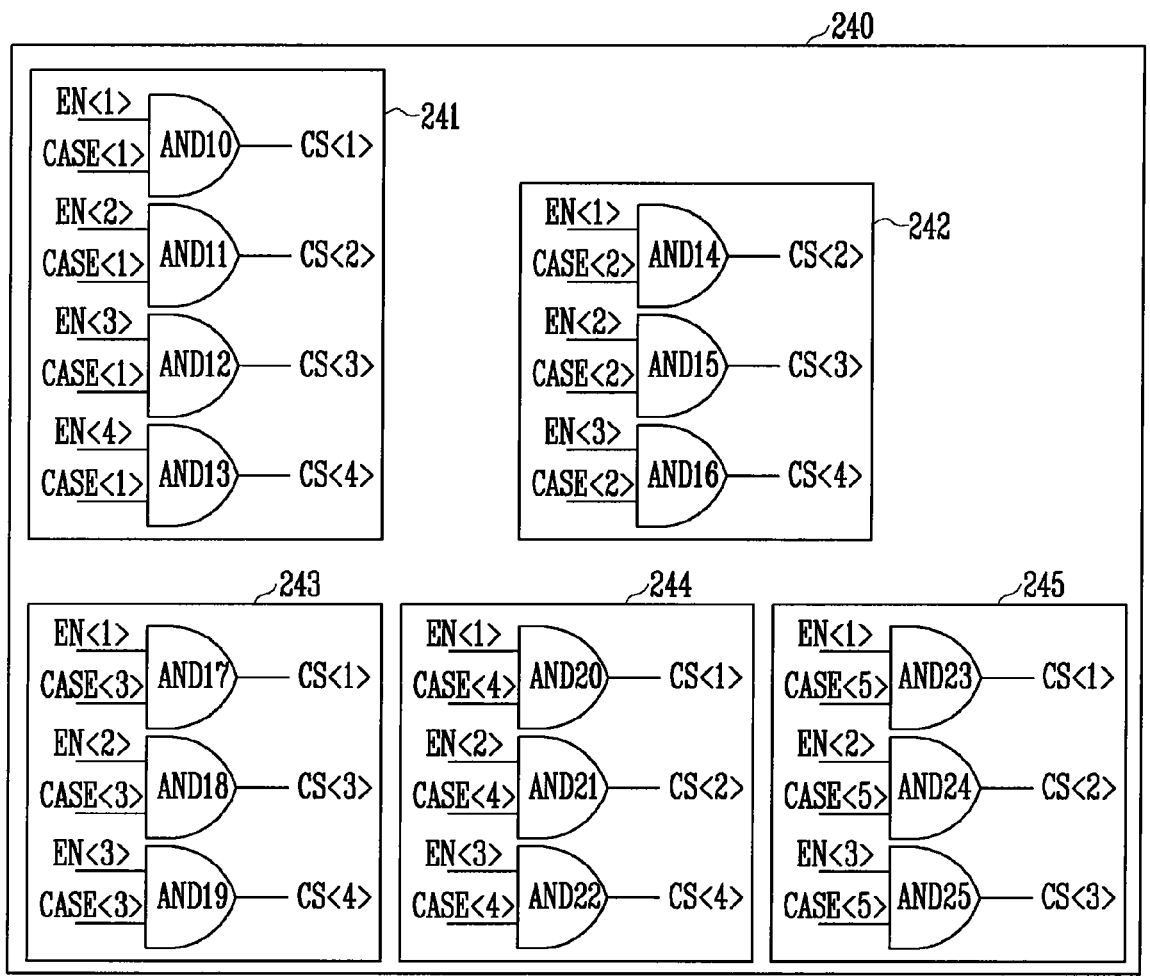
FIG. 2E is a detailed circuit diagram of a chip select logic shown in FIG. 2A.

FIG. 2E is a detailed circuit diagram of a chip select logic shown in FIG. 2A.

Referring to FIG. 2E, the chip select logic 240 includes first to fifth chip select units 241, 242, 243, 245 for outputting the chip select signals CS<1:4> according to first to fifth cases, respectively.

The first to fifth chip select units 241-245 operate in response to respective case signals and output the chip select signals CS<1:4> in respective cases.

The first chip select unit 241 includes tenth to thirteenth AND gates AND10, AND 11, AND12, and AND13. The second chip select unit 242 includes fourteenth to sixteenth AND gates AND14, AND15, and AND16. The third chip select unit 243 includes seventeenth to nineteenth AND gates AND17, AND18, and AND19. The fourth chip select unit 244 includes twentieth to twenty-second AND gates AND20, AND21, and AND22. The fifth chip select unit 245 includes twenty-third to twenty-fifth AND gates AND23, AND24, and AND25.

The tenth AND gate AND10 receives the first enable signal EN<1> and the first case signal CASE<1>, performs an AND operation on the first enable signal EN<1> and the first case signal CASE<1>, and outputs the result as the first chip select signal CS<1>. The eleventh AND gate AND11 receives the second enable signal EN<2> and the first case signal CASE<1>, performs an AND operation on the second enable signal EN<2> and the first case signal CASE<1>, and outputs the result as the second chip select signal CS<2>.

The twelfth AND gate AND12 receives the third enable signal EN<3> and the first case signal CASE<1>, performs an AND operation on the third enable signal EN<3> and the first case signal CASE<1>, and outputs the result as the third chip select signal CS<3>. The thirteenth AND gate AND13 receives the fourth enable signal EN<4> and the first case signal CASE<1>, performs an AND operation on the fourth enable signal EN<4> and the first case signal CASE<1>, and outputs the result as the fourth chip select signal CS<4>.

The fourteenth AND gate AND14 receives the first enable signal EN<1> and the second case signal CASE<2>, performs an AND operation on the first enable signal EN<1> and the second case signal CASE<2>, and outputs the result as the second chip select signal CS<2>. The fifteenth AND gate AND15 receives the second enable signal EN<2> and the second case signal CASE<2>, performs an AND operation on the second enable signal EN<2> and the second case signal CASE<2>, and outputs the result as the third chip select signal CS<3>. The sixteenth AND gate AND16 receives the third enable signal EN<3> and the second case signal CASE<2>, performs an AND operation on the third enable signal EN<3> and the second case signal CASE<2>, and outputs the result as the fourth chip select signal CS<4>.

The seventeenth AND gate AND17 receives the first enable signal EN<1> and the third case signal CASE<3>, performs an AND operation on the first enable signal EN<1> and the third case signal CASE<3>, and outputs the result as the first chip select signal CS<1>. The eighteenth AND gate AND18 receives the second enable signal EN<2> and the third case signal CASE<3>, performs an AND operation on the second enable signal EN<2> and the third case signal CASE<3>, and outputs the result as the third chip select signal CS<3>. The nineteenth AND gate AND19 receives the third enable signal EN<3> and the third case signal CASE<3>, performs an AND operation on the third enable signal EN<3> and the third case signal CASE<3>, and outputs the result as the fourth chip select signal CS<4>.

The twentieth AND gate AND20 receives the first enable signal EN<1> and the fourth case signal CASE<4>, performs an AND operation on the first enable signal EN<1> and the fourth case signal CASE<4>, and outputs the result as the first chip select signal CS<1>. The twenty-first AND gate AND21 receives the second enable signal EN<2> and the fourth case signal CASE<4>, performs an AND operation on the second enable signal EN<2> and the fourth case signal CASE<4>, and outputs the result as the second chip select signal CS<2>. The twenty-second AND gate AND22 receives the third enable signal EN<3> and the fourth case signal CASE<4>, performs an AND operation on the third enable signal EN<3> and the fourth case signal CASE<4>, and outputs the result as the fourth chip select signal CS<4>.

The twenty-third AND gate AND23 receives the first enable signal EN<1> and the fifth case signal CASE<5>, performs an AND operation on the first enable signal EN<1> and the fifth case signal CASE<5>, and outputs the result as the first chip select signal CS<1>. The twenty-fourth AND gate AND24 receives the second enable signal EN<2> and the fifth case signal CASE<5>, performs an AND operation on the second enable signal EN<2> and the fifth case signal CASE<5>, and outputs the result as the second chip select signal CS<2>. The twenty-fifth AND gate AND25 receives the third enable signal EN<3> and the fifth case signal CASE<5>, performs an AND operation on the third enable signal EN<3> and the fifth case signal CASE<5>, and outputs the result as the third chip select signal CS<3>.

The first to fifth chip select units 241-245 are operational in a first case where all of the first to fourth chips 110-140 are operational, in a second case where the first chip 110 has failed, a third case where the second chip 120 has failed, a fourth case where the third chip 130 has failed, and a fifth case where the fourth chip has failed, respectively.

An operation of the control chip 200 of FIGS. 2A to 2D according to an embodiment of the present invention, which is constructed as described above, is described with reference to FIG. 3.

Figure 3A:
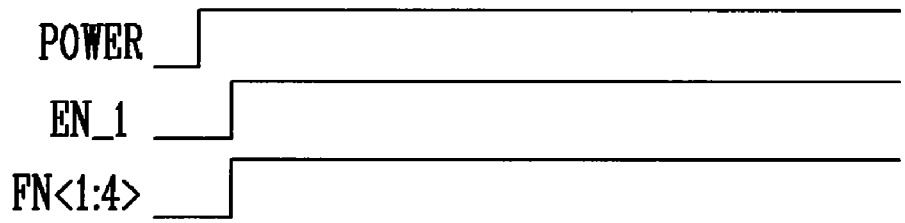
FIGS. 3A to 3C illustrate operational timing diagrams of the fuse circuit.
Figure 3B:
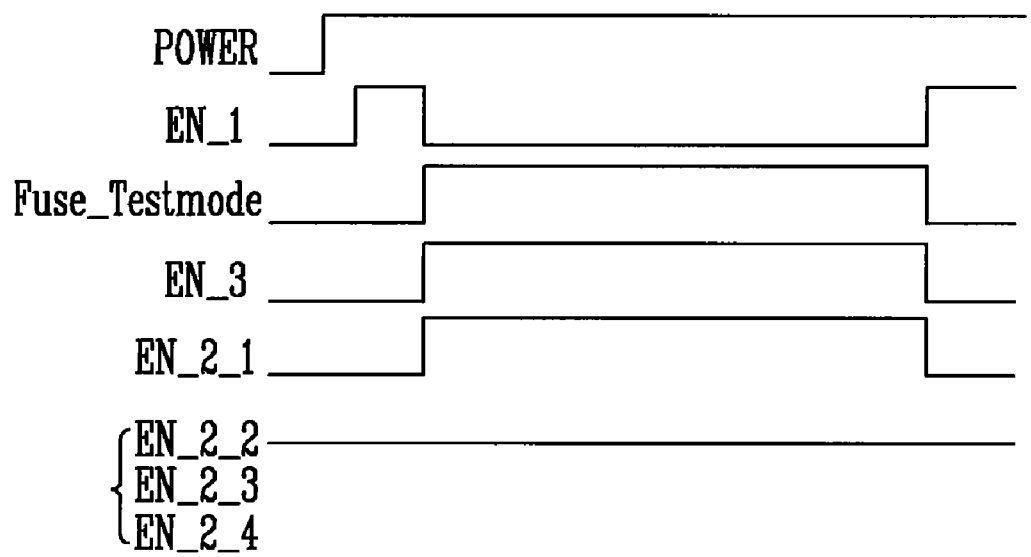
Figure 3C:
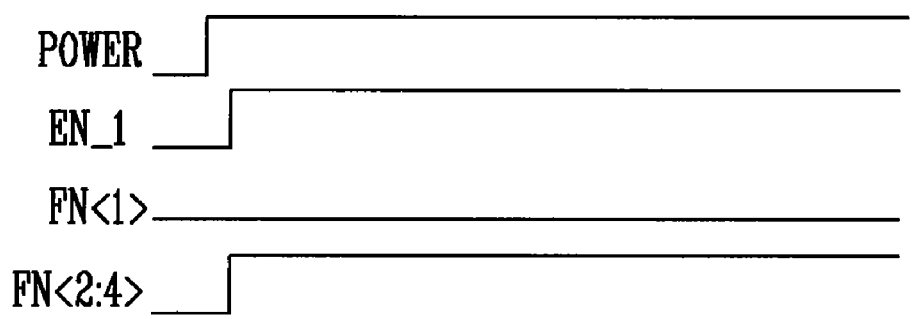

FIGS. 3A to 3C illustrate operational timing diagrams of the fuse circuit.

FIG. 3A shows an operational timing diagram of the fuse circuit when all the chips operate normally. FIG. 3B shows an operational timing diagram of the fuse circuit when fuses of failed chips reach breaking capacity. FIG. 3C shows an operational timing diagram of the fuse circuit when chips operate normally after the fuse reaches breaking capacity.

Referring to FIG. 3A, when the first to fourth chips 110-140 operate normally in the multi-package device 100 including the first to fourth chips 110-140 as shown in FIG. 1, the control unit 250 applies the control signal EN_1 of a high level to the fuse circuit 220 together with a power source. The remaining control signals EN_2_1 to EN_2_4, and EN_3 are applied at a low level.

If the control signal EN_1 is applied at a high level, the second, fifth, eighth and eleventh NMOS transistors N2, N5, N8 and N11 of the fuse circuit 220 are activated, and the nodes K2, K3, K4 and K5 are all connected to the ground node and therefore become a low level.

The first to fourth PMOS transistors P1-P4 are all activated and the first to fourth fuse signals FN<1:4> of a high level are output through the nodes K6, K7, K8 and K9. The case logic 230 outputs the first case signal CASE<1> in response to the first to fourth fuse signals FN<1:4>.

The address circuit 210 receives the address information A<0:1> from the control unit 250, sequentially generates the first to fourth enable signals EN<1:4>, and inputs them to the chip select logic 240.

The first chip select unit 241 of the chip select logic 240 is operated according to the first to fourth enable signals EN<1:4> and the first case signal CASE<1>, and sequentially outputs the first to fourth chip select signals CS<1:4> that select the first to fourth chips 110-140, so that the chips are selected.

In the case where the first chip 110 fails, the operation is changed as follows.

Referring to FIG. 3B, the control unit 250 checks that the first chip 110 has failed, and applies the fuse circuit 220 with a test mode signal Fuse_Testmode of a high level. The control unit 250 also applies the control signal EN_3 of a high level to the fuse circuit 220 while the test mode signal Fuse_Testmode is applied at a high level.

The control unit 250 applies the control signal EN_2_1 at a high level to control the first fuse signal FN<1> since the control unit 250 has checked that the first chip 110 has failed. The remaining control signals EN_2_2, EN_2_3 and EN_2_4 maintain a low level. The control signal EN_1, which is applied as a high level in a normal state, shifts to a low level in a test mode.

As the control signal EN_3 is applied, the high voltage pump 221 of the fuse circuit 220 starts operating and outputs a high voltage to the node K1.

The first level shifter 226 is operated in response to the control signal EN_2_1 and transfers the high voltage of the node K1 to the gate of the first NMOS transistor N1. Hence, the first NMOS transistor N1 is activated. As described above, the first NMOS transistor N1 is for use in a high voltage and is activated normally.

If the first NMOS transistor N1 is activated the node K1 is connected to the node K2 and the node K2 is applied with the high voltage. Although the node K2 is applied with the high voltage, the second NMOS transistor N2 operates normally. However, since the first PMOS transistor P1 is a transistor that deactivates at a high voltage, the first PMOS transistor P1 deactivates when the high voltage is applied to the node K2.

The second to fourth PMOS transistors P2-P4 maintain a normal state. After a lapse of a time period where the first PMOS transistor P1 deactivates due to the high voltage, the control unit 250 changes the test mode signal Fuse_Testmode to a low level and then finishes the test mode.

If the control chip 200 operates in a normal mode again after the test mode is performed, the control chip 200 operates as follows.

Referring to FIG. 3C, if a normal operation begins after the test mode, the control unit 250 of the control chip 200 applies the control signal EN_1 at a high level. Hence, the second, fifth, eighth and eleventh NMOS transistor N2, N5, N8 and N11 are activated, and the nodes K2, K3, K4 and K5 are connected to the ground node.

The second to fourth PMOS transistors P2 to P4 all operate normally and are therefore activated, thereby connecting a power supply voltage to the nodes K7, K8 and K9. Thus, the second to fourth fuse signals FN<2:4> are output at a high level.

However, since the first PMOS transistor P1 is deactivated, the node K2 and the node K6 are interconnected. Consequently, the first fuse signal FN<1> is output at a low level.

The case logic 230 outputs the second case signal CASE<2> according to the first to fourth fuse signals FN<1:4> output from the fuse circuit 220. That is, the sixth AND gate AND6 outputs a signal at a high level.

The address circuit 210 sequentially outputs the first to fourth enable signals EN<1:4> based on the address information A<0:1> input from the control unit 250.

Hence, the chip select logic 240 receives the first to fourth enable signals EN<1:4> and the second case signal CASE<2>. The second chip select unit 242 of the chip select logic 240 operates in response to the second case signal CASE<2>.

The second chip select unit 242 outputs the chip select signals CS<2:4> that sequentially select the second to fourth chips 120-140 but not the first chip 110. Accordingly, the multi-chip package 100 can select and operate the remaining chips 120 140 normally except for the first chip 110 in a state where the first chip 110 has failed.

The above description illustrates an example in which one chip has failed. However, in the event that one or more chips have failed, a case in each event can be determined and, therefore, chip select units of the case logic 230 and the chip select logic 240 accordingly can be configured additionally.

In brief, for example, in order to apply the present invention to a case where two of four chips have failed, the case logic 230 and the chip select logic 240 can be configured with respect to each case by taking into consideration the case as shown in the following Table 3.

TABLE 3

|  | FN<1> | FN<2> | FN<3> | FN<4> |
|---|---|---|---|---|
| CASE<1> | 1 | 1 | 1 | 1 |
| CASE<2> | 0 | 1 | 1 | 1 |
| CASE<3> | 1 | 0 | 1 | 1 |
| CASE<4> | 1 | 1 | 0 | 1 |
| CASE<5> | 1 | 1 | 1 | 0 |
| CASE<6> | 0 | 0 | 1 | 1 |
| CASE<7> | 0 | 1 | 0 | 1 |
| CASE<8> | 0 | 1 | 1 | 0 |
| CASE<9> | 1 | 0 | 0 | 1 |
| CASE<10> | 1 | 0 | 1 | 0 |
| CASE<11> | 1 | 1 | 0 | 0 |

As described above, in accordance with the multi-chip package according to the present invention, although any one of several packaged chips has failed, the remaining normally operational chips can be selected and operated.

The present invention is not limited to the disclosed embodiments, but may be implemented in various configurations. The embodiments are provided to complete the disclosure of the present invention and to allow those having ordinary skill in the art to understand the scope of the present invention. The present invention is defined by the scope of the claims.

What is claimed is:

1. A multi-chip package comprising:
a plurality of memory chips; and
a control chip configured to
store information about whether the memory chips are operating normally, and
select chips that are operating normally according to an address signal,
wherein the control chip comprises
a fuse circuit for storing information about whether the chips are operating normally and outputting fuse signals with respect to the respective chips based on the stored chip information,
a case logic for logically combining the fuse signals output from the fuse circuit and outputting case signals according to respective combination results,
a chip select logic for outputting chip select signals that sequentially select normally operating chips according to the case signals, and
a control unit for controlling the fuse circuit to control a fuse signal with respect to a chip that is not operating normally.

2. The multi-chip package of claim 1, wherein the control chip further comprises an address circuit that sequentially generates and outputs a plurality of enable signals according to the input address signals.

3. The multi-chip package of claim 2, wherein the fuse circuit comprises fuse signal output units for the respective chips, each of the fuse signal output units comprising:
a high voltage pump that generates and outputs a high voltage in a test mode;
a first switching element that outputs a fuse signal of a second voltage level according to a voltage level of a first node; and
a level shifter that applies the high voltage to the first switching element in response to a control signal in the test mode, wherein the high voltage is generated by the high voltage pump,
wherein the first switching element reaches breaking capacity when applied with the high voltage and outputs the fuse signal as the second voltage level.

4. The multi-chip package of claim 3, wherein the first switching element includes a low voltage transistor.

5. The multi-chip package of claim 3, wherein each of the fuse signal output units comprises a second switching element that connects the first node to a ground voltage in a normal operation mode.

6. The multi-chip package of claim 2, wherein the case logic comprises case signal output units that output different case signals, respectively, according to cases decided according to a combination of the fuse signals output from the fuse circuit.

7. The multi-chip package of claim 2, wherein the chip select logic comprises a plurality of chip select units that are respectively operated according to the case signals.

8. The multi-chip package of claim 7, wherein each of the plurality of chip select units outputs a chip select signal that selects a normally operating chip according to a combination of the respective set case signals and the enable signals.

9. A multi-chip package including a control chip, the control chip comprising:
a fuse circuit for outputting fuse signals to indicate whether a plurality of memory chips are operating normally;
a case logic for logically combining the fuse signals output from the fuse circuit and outputting case signals according to respective combination results;
a chip select logic for outputting chip select signals that sequentially select normally operating chips according to the case signals; and
a control unit for controlling the fuse circuit to control a fuse signal with respect to a chip that is not operating normally.

10. The multi-chip package of claim 9, wherein the control chip further comprises an address circuit that sequentially generates and outputs a plurality of enable signals according to the input address signals.

11. The multi-chip package of claim 10, wherein the fuse circuit comprises fuse signal output units for the respective chips, each of the fuse signal output units comprising:
a high voltage pump that generates and outputs a high voltage in a test mode;
a first switching element that outputs a fuse signal of a second voltage level according to a voltage level of a first node; and
a level shifter that applies the high voltage to the first switching element in response to a control signal in the test mode, wherein the high voltage is generated by the high voltage pump,
wherein the first switching element reaches breaking capacity when applied with the high voltage and outputs the fuse signal as the second voltage level.

12. The multi-chip package of claim 11, wherein the first switching element includes a low voltage transistor.

13. The multi-chip package of claim 11, wherein each of the fuse signal output units comprises a second switching element that connects the first node to a ground voltage in a normal operation mode.

14. The multi-chip package of claim 10, wherein the case logic comprises case signal output units that output different case signals, respectively, according to cases decided according to a combination of the fuse signals output from the fuse circuit.

15. The multi-chip package of claim 10, wherein the chip select logic comprises a plurality of chip select units that are respectively operated according to the case signals.

16. The multi-chip package of claim 15, wherein each of the plurality of chip select units outputs a chip select signal that selects a normally operating chip according to a combination of the respective set case signals and the enable signals.

17. A multi-chip package including a control chip, the control chip comprising:
a fuse circuit for outputting fuse signals to indicate whether a plurality of memory chips have failed;
a case logic for logically combining the fuse signals output from the fuse circuit and outputting case signals according to respective combination results;
a chip select logic for outputting chip select signals that sequentially select chips that have not failed according to the case signals; and
a control unit for controlling the fuse circuit to control a fuse signal with respect to a chip that has failed.

* * * * *